(12) United States Patent
Lai et al.

(10) Patent No.: US 12,336,158 B2
(45) Date of Patent: Jun. 17, 2025

(54) VEHICLE-MOUNTED DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Chengte Lai, Beijing (CN); Qiang Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/016,281

(22) PCT Filed: Feb. 25, 2022

(86) PCT No.: PCT/CN2022/078019
§ 371 (c)(1),
(2) Date: Jan. 13, 2023

(87) PCT Pub. No.: WO2023/159490
PCT Pub. Date: Aug. 31, 2023

(65) Prior Publication Data
US 2024/0414899 A1    Dec. 12, 2024

(51) Int. Cl.
*H05K 9/00* (2006.01)
*H05K 5/00* (2006.01)

(52) U.S. Cl.
CPC ......... *H05K 9/0054* (2013.01); *H05K 5/0026* (2013.01)

(58) Field of Classification Search
CPC ........................ H05K 9/0054; H05K 5/0026
See application file for complete search history.

(56) References Cited

U.S. PATENT DOCUMENTS

| | | | |
|---|---|---|---|
| 9,450,038 B2 * | 9/2016 | Kwon | H01L 21/31111 |
| 10,314,180 B2 * | 6/2019 | Wang | H05K 5/0017 |
| 10,593,899 B2 * | 3/2020 | Jung | H10K 50/818 |

(Continued)

FOREIGN PATENT DOCUMENTS

| | | |
|---|---|---|
| CN | 103889142 A | 6/2014 |
| CN | 209103039 U | 7/2019 |

(Continued)

*Primary Examiner* — Rockshana D Chowdhury
(74) *Attorney, Agent, or Firm* — IPro, PLLC (57) ABSTRACT

A vehicle-mounted display apparatus includes: a display panel, including a display surface and a non-display surface facing away from the display surface; a metal backboard, arranged on a side at which the non-display surface is located, and the metal backboard is grounded; and a circuit board assembly, including a first circuit board arranged on a side of the metal backboard away from the display panel, the first circuit board is in signal connection with the display panel through a first flexible printed circuit, the first circuit board includes a first front surface facing away from the metal backboard, and a first back surface facing to the metal backboard, the first front surface has circuit patterns, at least one surface of the first circuit board has first copper leakage regions, and the first copper leakage regions being electrically connected with the metal backboard through a first conductive mechanism.

20 Claims, 4 Drawing Sheets

(56) References Cited

U.S. PATENT DOCUMENTS

| | | | | |
|---|---|---|---|---|
| 10,637,007 B1* | 4/2020 | Wang | ............... | H10K 59/131 |
| 10,707,289 B2* | 7/2020 | Li | ............... | H10K 77/111 |
| 10,803,776 B2* | 10/2020 | Huang | ............... | H10D 86/443 |
| 10,863,619 B2* | 12/2020 | Lee | ............... | H10K 59/12 |
| 10,873,043 B2* | 12/2020 | Jin | ............... | G06F 3/04164 |
| 10,910,592 B2* | 2/2021 | Kuon | ............... | H10K 59/8722 |
| 10,976,850 B2* | 4/2021 | Zheng | ............... | G02F 1/133331 |
| 11,048,353 B1* | 6/2021 | Luo | ............... | G09F 9/301 |
| 11,049,914 B2* | 6/2021 | Li | ............... | H10K 50/868 |
| 11,284,547 B2* | 3/2022 | Shin | ............... | H05K 9/0054 |
| 11,294,116 B2* | 4/2022 | Ouyang | ............... | G02F 1/133528 |
| 11,329,263 B2* | 5/2022 | Park | ............... | G06F 1/1637 |
| 11,789,314 B2* | 10/2023 | Wan | ............... | G02F 1/133603 |
| | | | | 362/97.1 |
| 11,882,679 B2* | 1/2024 | Zhang | ............... | F28F 21/06 |
| 2014/0176840 A1 | 6/2014 | Hashido | | |
| 2018/0341290 A1* | 11/2018 | Sim | ............... | G06F 1/1658 |

FOREIGN PATENT DOCUMENTS

| | | |
|---|---|---|
| CN | 113570969 A | 10/2021 |
| JP | 2017161792 A | 9/2017 |

* cited by examiner

Fig. 1

--prior art--

VEHICLE-MOUNTED DISPLAY APPARATUS

CROSS REFERENCE TO RELATED APPLICATIONS

The present disclosure is a national phase entry under 35 U.S.C § 371 of International Application No. PCT/CN2022/078019, filed Feb. 25, 2022, and entitled "VEHICLE-MOUNTED DISPLAY APPARATUS".

FIELD

The present application relates to the field of display devices, and in particular to a vehicle-mounted display apparatus.

BACKGROUND

In the prior art, electromagnetic compatibility (EMC) is a prerequisite for all electronic products, and is also an important factor that restricts user satisfaction and influences mass production. Presently, the EMC of vehicle-mounted display apparatus is tested before delivery. Although EMC has been fully considered in the design of circuits and structures, the problem of EMC failure cannot be completely avoided. Under some test frequency bands of an antenna during tests, the phenomena of a white screen and a black screen will occur in a display screen, to result in EMC failure of the display screen.

Therefore, how to solve the problem of the EMC of the electronic products is a problem to be urgently solved by those skilled in the art.

SUMMARY

The present application provides a vehicle-mounted display apparatus. The vehicle-mounted display apparatus may avoid influence of electromagnetic interference on components on a circuit board and solve problems of a white screen and a black screen of a display panel in some frequency bands, and is easy to manufacture without increase in cost.

In order to achieve the above objective, the present disclosure provides the following solution:

A vehicle-mounted display apparatus includes:
- a display panel, including a display surface and a non-display surface facing away from the display surface;
- a metal backboard, arranged on a side at which the non-display surface is located, and the metal backboard is grounded; and
- a circuit board assembly, including a first circuit board arranged on a side of the metal backboard away from the display panel, the first circuit board is in signal connection with the display panel through a first flexible printed circuit, the first circuit board includes a first front surface facing away from the metal backboard, and a first back surface facing to the metal backboard, the first front surface is provided with circuit patterns, at least one surface of the first circuit board is provided with a first copper leakage region, and the first copper leakage regions is electrically connected with the metal backboard through a first conductive mechanism.

The vehicle-mounted display apparatus provided in embodiments of the present disclosure includes the display panel, the metal backboard, and the circuit board assembly, where the display panel includes the display surface, and the non-display surface facing away from the display surface, the metal backboard is arranged on a side at which the non-display surface is located, and is grounded, and the circuit board assembly includes the first circuit board, the first circuit board is in signal connection with the display panel through the first flexible printed circuit, at least one surface of the first circuit board has a first copper leakage region, and the first copper leakage region is electrically connected with the metal backboard through the first conductive mechanism. Since the first copper leakage regions on the first circuit board are electrically connected with the metal backboard through the first conductive mechanism, the first circuit board may be grounded, and electromagnetic interference energy on the first circuit board may be transmitted to a ground (GND), such that influence of electromagnetic interference on components on a circuit board assembly is avoided, abnormal picture display on the display panel is further avoided, problems of a white screen and a black screen of the display panel in some frequency bands are solved, and the vehicle-mounted display apparatus satisfies the requirements of electromagnetic compatibility in a full frequency band test, and is easy to manufacture without increase in cost.

Optionally, the first front surface has a plurality of first copper leakage regions, the plurality of first copper leakage regions of the first front surface do not overlap the circuit patterns of the first front surface, the first conductive mechanism includes conductive adhesive tape, and the plurality of first copper leakage regions of the first front surface are electrically connected with the metal backboard through the conductive adhesive tape.

Optionally, the plurality of first copper leakage regions of the first front surface are arranged adjacent to an edge of the first circuit board.

Optionally, the first back surface has at least one first copper leakage region, the first conductive mechanism includes a double-sided conductive adhesive located between the first circuit board and the metal backboard, and the at least one first copper leakage region of the first back surface is electrically connected with the metal backboard through the double-sided conductive adhesive.

Optionally, the at least one first copper leakage region of the first back surface is arranged on the entire first back surface.

Optionally, the first front surface of the first circuit board is covered with an electromagnetic interference shielding film.

Optionally, the first circuit board is a timing controller board.

Optionally, the circuit board assembly further includes a second circuit board arranged on a side of the first circuit board away from the metal backboard, and the second circuit board is in signal connection with the first circuit board through a second flexible printed circuit, the second circuit board includes a second front surface facing away from the metal backboard, and a second back surface facing to the metal backboard, at least one surface of the second circuit board is provided with a second copper leakage region, and the second copper leakage region is electrically connected with the metal backboard through a second conductive mechanism.

Optionally, the second back surface has at least one second copper leakage region, the second conductive mechanism includes a conductive stud, the second circuit board is fixedly connected with the metal backboard via the conductive stud extending in a first direction, the conductive stud is in contact with the at least one second copper leakage region of the second back surface, and the first direction is an arrangement direction of the second circuit board and the metal backboard.

Optionally, the second conductive mechanism includes conductive foam between the second circuit board and the metal backboard, and the at least one second copper leakage region of the second back surface is electrically connected with the metal backboard through the conductive foam.

Optionally, the at least one second copper leakage region of the second back surface is arranged on the entire second back surface.

Optionally, the second circuit board is a system on chip board.

Optionally, the first flexible printed circuit is a chip on film.

REFERENCE SIGNS

01—organic light emitting display; 02—timing controller board; 021—component—: 03—system on chip board; 04—chip on film; 05—flexible printed circuit; and 06—antenna;

1—display panel—: 2—metal backboard; 3—circuit board assembly; 31—first circuit board; 311—functional element; 32—second circuit board; 4—first flexible printed circuit; 41—display driver integrated circuit; 51—conductive adhesive tape; 52—double—sided conductive adhesive; 53—conductive foam; 6—second flexible printed circuit; 7—conductive stud; A—copper leakage region; A1—first copper leakage region; and A2—second copper leakage region.

DETAILED DESCRIPTION OF THE EMBODIMENTS

The solutions in examples of the present disclosure are clearly and completely described below with reference to the accompanying drawings in the embodiments of the present disclosure. Apparently, the described examples are only some embodiments rather than all embodiments of the present disclosure. On the basis of the embodiments in the present disclosure, all other embodiments obtained by those of ordinary skill in the art without making creative efforts fall within the scope of protection of the present disclosure.

Figure 1:
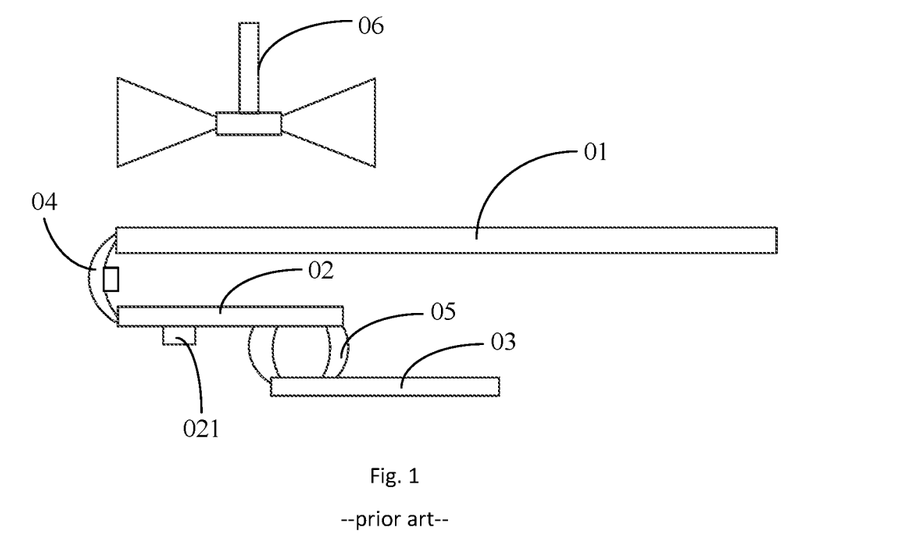
FIG. 1 is a schematic structural diagram of a display device in the prior art.

In the related art, a structure of a vehicle-mounted display apparatus may be as shown in FIG. 1. A specific structure of the vehicle-mounted display apparatus includes an organic light emitting display (OLED) 01, a timing controller board (TCON board) 02, and a system on chip board (SOC board) 03, where the OLED is bound to the TCON board via a chip on film (COF) 04, and the TCON board 02 is connected with the SOC board 03 through a flexible printed circuit (FPC) 05. An electromagnetic compatibility (EMC) test is carried out on the basis of current design of the structure of the vehicle-mounted display apparatus in FIG. 1, an antenna 06 may be arranged at a distance of 20 mm from the OLED 01, and phenomena of a white screen and a black screen may occur in a display screen in a frequency band in which a transmitting frequency of the antenna 06 ranges from 360 MHz to 480 MHZ, to result in EMC failure of the display screen. Through analysis, it is found that when the display screen works, voltage of each group and output waveforms of a TP signal, a STV signal and a SD signal are normal. In an abnormal state, normal display may be restored after a timing controller reset terminal (TCON RST) is shorted to a ground (GND). The solution that an electromagnetic interference (EMI) shielding film entirely coats the COF may guarantee to pass an EMC test, and thus an EMI path is speculated: EMI energy is routed via the COF 04 to the TCON board 02, a component 021 on the TCON board 02 is influenced to result in an abnormal picture, and it is necessary to coat the COF so as to shield EMI energy. Although the EMC test can be passed by expanding the EMI shielding film to achieve entirely coat the COF, the solution that the EMI shielding film entirely coats the COF is still difficult to use in practice due to problems of cost increase and process difficulty.

Figure 2:
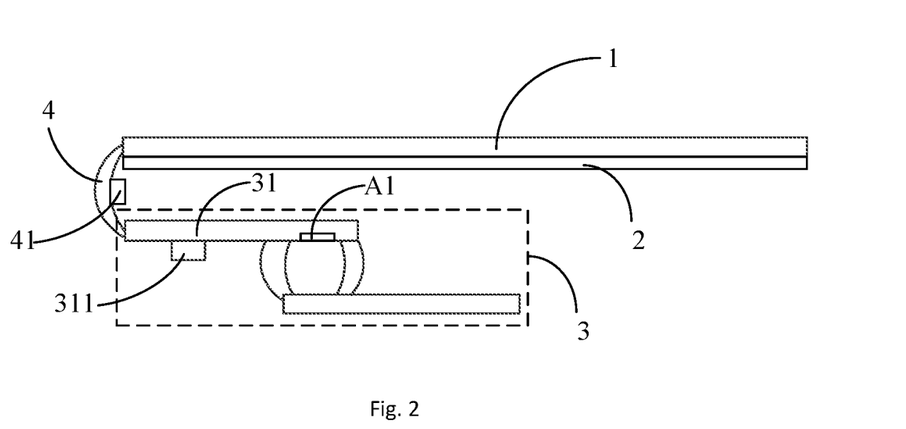
FIG. 2 is a schematic structural diagram of a vehicle-mounted display apparatus provided in an embodiment of the present disclosure.

In order to solve the above problem, the present disclosure provides a vehicle-mounted display apparatus. As shown in FIG. 2, the vehicle-mounted display apparatus includes:

a display panel 1, the display panel 1 includes a display surface and a non-display surface facing away from the display surface;

a metal backboard 2, the metal backboard 2 is arranged on a side at which the non-display surface is located, and the metal backboard 2 is grounded; and a circuit board assembly 3, the circuit board assembly 3 includes a first circuit board 31 located on a side of the metal backboard 2 away from the display panel 1, the first circuit board 31 is in signal connection with the display panel 1 through a first flexible printed circuit 4, the first circuit board 31 includes a first front surface facing away from the metal backboard 2, and a first back surface facing to the metal backboard 2, the first front surface is capable of having circuit patterns, at least one surface of the first circuit board 31 is provided with a first copper leakage region A1, and the first copper leakage region A1 is electrically connected with the metal backboard 2 through a first conductive mechanism.

The vehicle-mounted display apparatus provided in the above embodiment of the invention includes the display panel 1, the metal backboard 2, and the circuit board assembly 3, where the display panel 1 includes the display surface, and the non-display surface facing away from the display surface, the metal backboard 2 is arranged on a side at which the non-display surface is located, and is grounded, and the circuit board assembly 3 includes the first circuit board 31, at least one surface of the first circuit board 31 is provided with a first copper leakage region A1. Since the first copper leakage region A1 on the first circuit board 31 are electrically connected with the metal backboard 2 through the first conductive mechanism, the first circuit board 31 may be grounded, and EMI energy on the first circuit board may be transmitted to the GND, such that influence of EMI on components on the circuit board assembly is avoided, abnormal picture display on the display panel 1 is further avoided, problems of a white screen and a black screen of the display panel 1 in some frequency bands are solved, and the vehicle-mounted display apparatus satisfies the requirements of EMC in a full frequency band test, and is easy to manufacture without increase in cost.

In the embodiments of the invention, the circuit patterns on the first front surface may include pads for connecting functional elements 311, and a wire connected between the pads. The functional elements 311 are electrically connected with the corresponding pads, such that the circuit patterns on the first front surface and the functional elements 311 jointly form a driving circuit for controlling display of the display panel 1. EMI energy on the first circuit board 31 may be led out via the arrangement of the first copper leakage region A1 on the first circuit board 31, such that the influence of EMI on the functional elements 311 on the first circuit board 31 is avoided, and picture display of the display panel 1 is ensured.

The display panel 1 may be an OLED or a liquid crystal display panel, which is not limited herein.

The metal backboard 2 may be an aluminum (Al) backboard having electric conductivity.

The first circuit board 31 is a printed circuit board (PCB), and may be a TCON board, and the TCON board may be used for receiving image data, and determining a timing control signal to drive the display panel 1 to display an image. The first circuit board 31 may also be other driving circuit boards, which is not limited herein, and may be configured according to actual situations. The functional elements 311 on the first front surface of the first circuit board 31 may be electronic elements such as a control chip, a capacitor and a resistor.

The first flexible printed circuit 4 may be a COF, and further includes electronics attached on the flexible printed circuit, and the electronics may be a display driver, a display driver integrated circuit (DDIC) 41, etc. The display panel 1 is in signal connection with the TCON board via a chip on film technology to carry out timing control over picture display of the display panel 1. Optionally, the first flexible printed circuit 4 may also be other types of flexible printed circuits, which is not limited herein, and may be configured according to actual situations. The number of the first flexible printed circuits 4 connected between the display panel 1 and the first circuit board 31 is also not limited herein, and may be configured according to actual situations.

Figure 3:
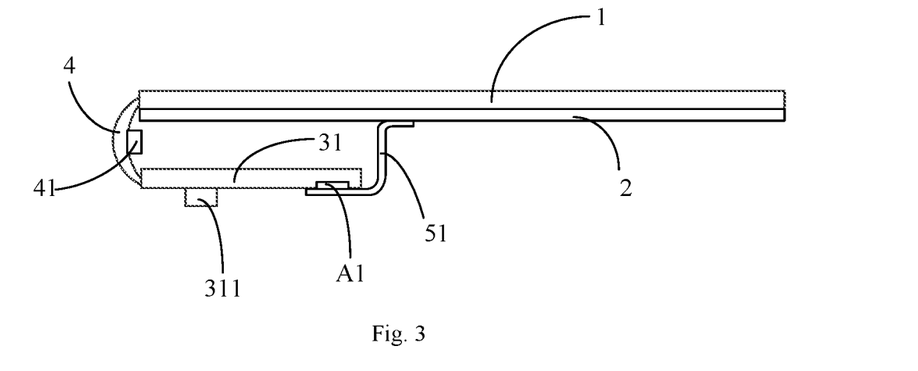
FIG. 3 is a schematic structural diagram of another vehicle-mounted display apparatus provided in an embodiment of the present disclosure.
Figure 4:
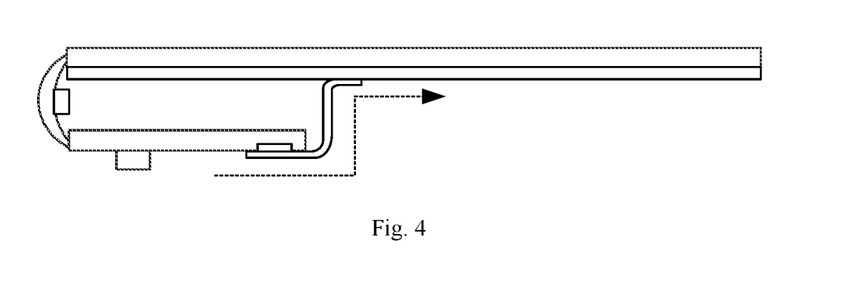
FIG. 4 is a state diagram of a vehicle-mounted display apparatus provided in an embodiment of the present disclosure.

In a possible embodiment, as shown in FIG. 3, the first front surface of the first circuit board 31 may have a plurality of first copper leakage regions A1, the plurality of first copper leakage regions A1 of the first front surface do not overlap the circuit patterns of the first front surface, the first conductive mechanism may be conductive adhesive tape 51, the first copper leakage regions A1 of the first front surface may be electrically connected with the metal backboard 2 through the conductive adhesive tape 51, multi-point grounding of the first circuit board 31 may be achieved through the plurality of first copper leakage regions A1, to accelerate release of EMI energy to the GND, and the vehicle-mounted display apparatus has a simple structure without increasing manufacturing cost. Since the first front surface of the first circuit board 31 has the circuit patterns and the functional elements 311, a plurality of first copper leakage regions A1 may be arranged in regions other than the circuit patterns and the functional elements 311, and may achieve multi-point grounding of the first circuit board 31, and a grounding path of the first copper leakage regions A1 of the first front surface on the first circuit board 31 may be as shown by an arrow in FIG. 4. In order to better avoid the influence of EMI on the functional elements 311 on the first circuit board 31, the first copper leakage regions A1 may be arranged as much as possible in the regions of the first circuit board 31 other than the circuit patterns. For example, four first copper leakage regions A1 may be arranged on the first front surface of the first circuit board 31, and each first copper leakage region A1 may be electrically connected with the metal backboard 2 through the conductive adhesive tape 51, to ground the first copper leakage regions A1. The area of each first copper leakage region A1 is not limited herein, and the bigger the first copper leakage regions at defined positions are, the better the effect is.

Figure 5:
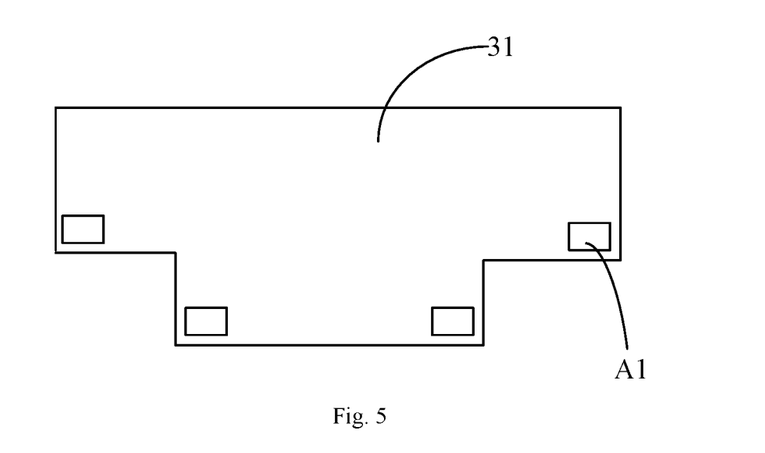
FIG. 5 is a schematic structural diagram of a first front surface of a first circuit board provided in an embodiment of the present disclosure.

Optionally, the plurality of first copper leakage regions A1 of the first front surface of the first circuit board 31 may be arranged adjacent to an edge of the first circuit board 31, which is shown in FIG. 5. Since a small number of circuit patterns and functional elements 311 are arranged at the edge of the first front surface of the first circuit board 31, space where the first copper leakage regions A1 may be arranged is large at the edge of the first front surface without influencing arrangement of the circuit patterns on the first front surface of the first circuit board 31. The plurality of first copper leakage regions A1 are arranged at the edge of the first front surface, such that the conductive adhesive tape 51 may adhere conveniently, and the influence of the conductive adhesive tape 51 on the functional elements 311 on the first circuit board 31 during gluing may be avoided. For example, four first copper leakage regions A1 on the first front surface of the first circuit board 31 shown in FIG. 5 are arranged at the edge of the first circuit board 31, and the four first copper leakage regions A1 may be averagely arranged on two sides of the first circuit board 31.

Figure 6:
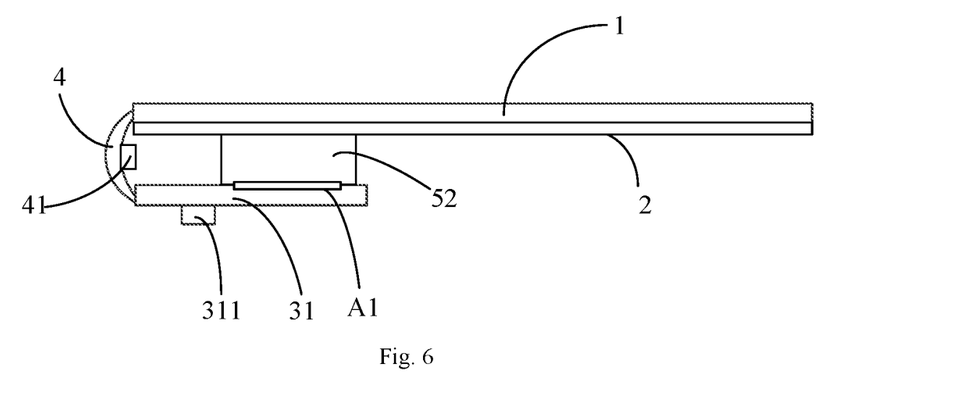
FIG. 6 is a schematic structural diagram of another vehicle-mounted display apparatus provided in an embodiment of the present disclosure.
Figure 7:
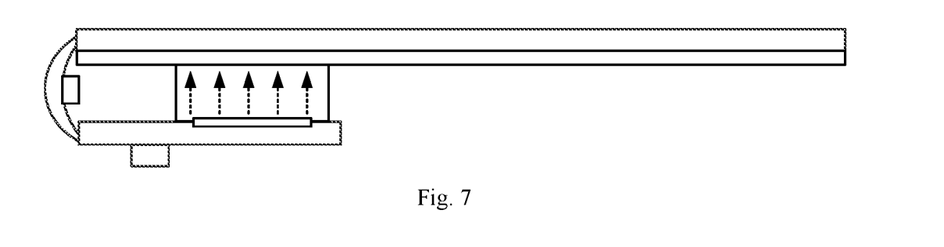
FIG. 7 is a state diagram of another vehicle-mounted display apparatus provided in an embodiment of the present disclosure.

In another possible embodiment, as shown in FIG. 6, the first back surface of the first circuit board 31 may have at least one first copper leakage region A1, the first conductive mechanism may be a double-sided conductive adhesive 52 located between the first circuit board and the metal backboard, and the at least one first copper leakage region A1 of the first back surface may be electrically connected with the metal backboard 2 through the double-sided conductive adhesive 52. Generally, a large number of functional elements and circuit patterns are arranged on the front surface of the circuit board, a small number of functional elements and circuit patterns are arranged on the back surface of the circuit board, or no copper leakage region and no circuit pattern are arranged, and therefore, the copper leakage region may be arranged on the back surface of the first circuit board, such that the area of the copper leakage region may be expanded without influencing arrangement of the functional elements and the circuit patterns on the first circuit board. Moreover, since the first copper leakage region A1 is arranged on the first back surface, and the double-sided conductive adhesive 52 is located between the first back surface and the metal backboard 2, a connection structure between the first copper leakage region A1 and the metal backboard 2 may be simplified without increasing manufacturing cost, and a grounding path of the first copper leakage region A1 may be shortened to accelerate release of EMI, so as to avoid interference to the first circuit board 31, and the grounding path of the first copper leakage region A1 of the first back surface on the first circuit board 31 may be as shown by arrows in FIG. 7.

In some embodiments, a plurality of first copper leakage regions A1 may be arranged on the first back surface of the first circuit board 31 to achieve multi-point grounding, such that the influence of EMI on the functional elements 311 on the first circuit board 31 may be better avoided. For example, three first copper leakage regions A1 are arranged on the first back surface. Under the condition that the first backboard of the first circuit board 31 does not have the circuit patterns and the functional elements 311, the first copper leakage regions A1 may be arranged on the entire first back surface, to expand the arrangement area of the first copper leakage regions A1.

In some embodiments, on the first circuit board 31, the first copper leakage regions A1 may be arranged only on the first front surface, the first copper leakage regions A1 may be arranged only on the first back surface, or the first copper leakage regions A1 may be arranged on both the first front surface and the first back surface of the first circuit board 31, such that release of EMI energy may be accelerated. When the first copper leakage regions A1 are arranged on the first front surface and the first back surface of the first circuit board 31, a connection structure of the first copper leakage regions A1 and the metal backboard 2 may be the same as a connection structure when the first copper leakage regions A1 are arranged on the first front surface or the second back surface. The arrangement positions of the first copper leakage regions A1 on the first circuit board 31 are not limited herein, and may be configured according to actual situations.

In the above embodiments of the invention, in order to avoid the influence of EMI on the functional elements 311 on the first circuit board 31, the first front surface of the first circuit board 31 may be covered with an EMI shielding film, to avoid influence of EMI on a displayed picture of the display panel 1.

Figure 8:
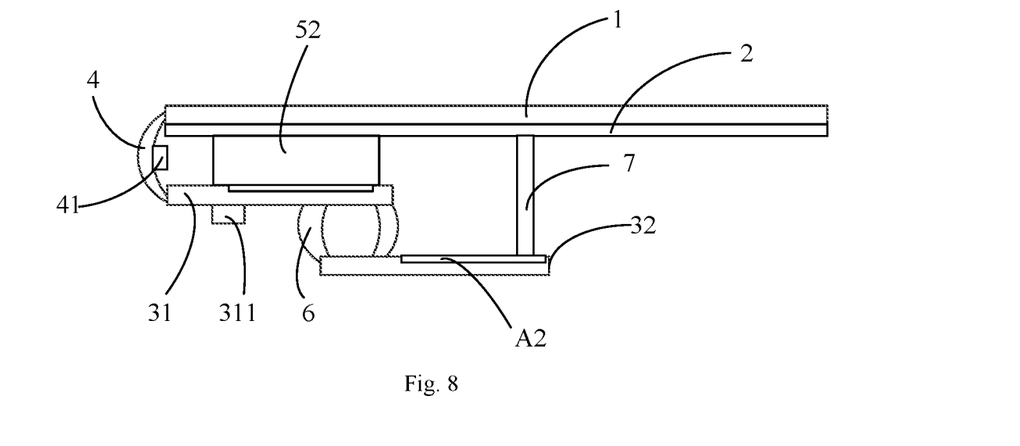
FIG. 8 is a schematic structural diagram of another vehicle-mounted display apparatus provided in an embodiment of the present disclosure.

In the embodiments of the present disclosure, as shown in FIG. 8, the circuit board assembly 3 further includes a second circuit board 32 located on a side of the first circuit board 31 away from the metal backboard 2. The second circuit board 32 may be in signal connection with the first circuit board 31 through a second flexible printed circuit 6, the second circuit board 32 includes a second front surface facing away from the metal backboard 2, and a second back surface facing to the metal backboard 2, at least one surface of the second circuit board 32 may have second copper leakage regions A2, the second copper leakage regions A2 are electrically connected with the metal backboard 2 through a second conductive mechanism, and a grounding path may be added on the second circuit board 32 to accelerate conduction of EMI energy to the GND.

The second circuit board 32 may be a SOC board, circuit patterns may be arranged on the second front surface, functional elements may be connected on the circuit patterns on the second front surface, and the functional elements connected on the circuit patterns on the second front surface may include elements such as a SOC. The specific functional elements on the second front surface are not limited herein, and may be configured according to actual requirements. The SOC board may output a data signal to control display of display panel 1, and the TCON board may convert the data signal into a timing control signal recognizable by the display panel 1, and the timing control signal is output to the display panel 1, to display pictures on the display panel 1.

The number of second flexible printed circuits 6 connected between the first circuit board 31 and the second circuit board 32 is not limited herein, and may be configured according to actual situations.

On the second circuit board 32, the second copper leakage regions A2 may be arranged only on the second front surface, the second copper leakage regions A2 may be arranged only on the second back surface, or the second copper leakage regions A2 may be arranged on both the second front surface and the second back surface, which is not limited herein, and is selected according to actual situations.

Figure 9:
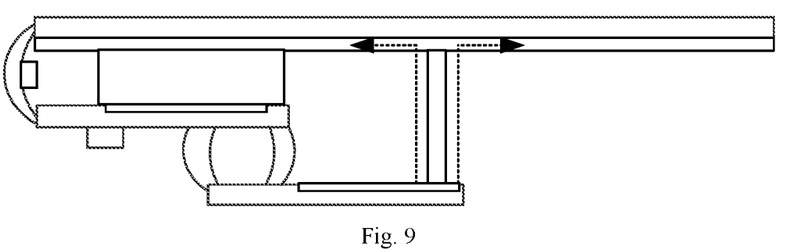
FIG. 9 is a state diagram of another vehicle-mounted display apparatus provided in an embodiment of the present disclosure.

In some embodiments, as shown in FIG. 8, the second back surface of the second circuit board 32 may have at least one second copper leakage region A2, the second conductive mechanism may be a conductive stud, the second circuit board 32 may be fixedly connected to the metal backboard 2 via the conductive stud 7 extending in a first direction, the conductive stud 7 is in contact with the at least one second copper leakage region A2 of the second back surface, and the first direction is an arrangement direction of the second circuit board 32 and the metal backboard 2. A small number of circuit patterns and functional elements are arranged on the second back surface of the second circuit board, or no circuit pattern and functional element are arranged, such that the area of the copper leakage region may be configured to be large enough. The second copper leakage region A2 is arranged on the second back surface of the second circuit board 32, and the conductive stud 7 fixedly connecting the second circuit board 32 and the metal backboard 2 is in contact with the second copper leakage region A2, such that the second copper leakage region A2 on the second back surface may be electrically connected to the metal backboard 2, to accelerate conduction of EMI energy to the GND. The vehicle-mounted display apparatus has a simple structure without increasing manufacturing cost. A grounding path of the second copper leakage region A2 on the first back surface on the second circuit board 32 may be as shown by arrows in FIG. 9. The number of the conductive studs 7 may be greater than or equal to three, such that the second circuit board may be firmly connected to the metal backboard, and the grounding path may be increased to accelerate conduction of EMI energy. The plurality of second copper leakage regions A2 may be arranged on the second back surface, such that multi-point grounding on the second circuit board 32 is achieved to avoid influence of EMI on the functional elements on the circuit board.

Figure 10:
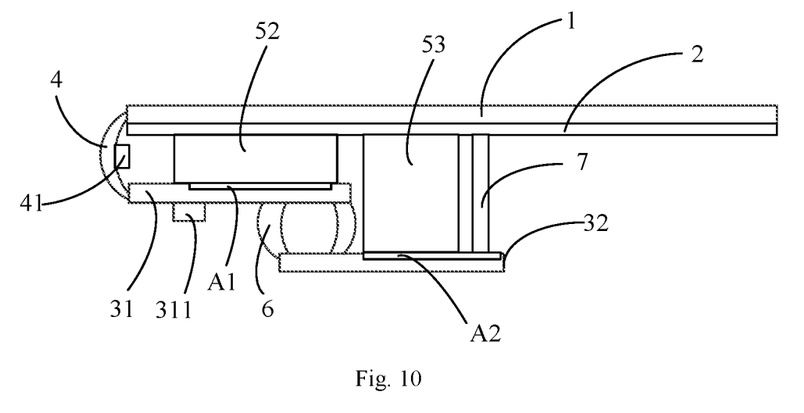
FIG. 10 is a schematic structural diagram of another vehicle-mounted display apparatus provided in an embodiment of the present disclosure.

In some embodiments, as shown in FIG. 10, the second conductive mechanism further includes conductive foam 53 between the second circuit board 32 and the metal backboard, and the second copper leakage region A2 of the second back surface of the second circuit board 32 is further electrically connected to a side of the metal backboard 2 away from the display panel 1 through the conductive foam 53, such that a contact area between the second copper leakage region A2 on the second back surface and the metal backboard 2 may be expanded to accelerate conduction of EMI energy to the GND.

In some embodiments, the second back surface of the second circuit board 32 may not have the circuit patterns and the functional elements, such that the second copper leakage region A2 may be arranged on the entire second back surface, and the area of the second copper leakage region A2 on the second circuit board 32 may be expanded.

Figure 11:
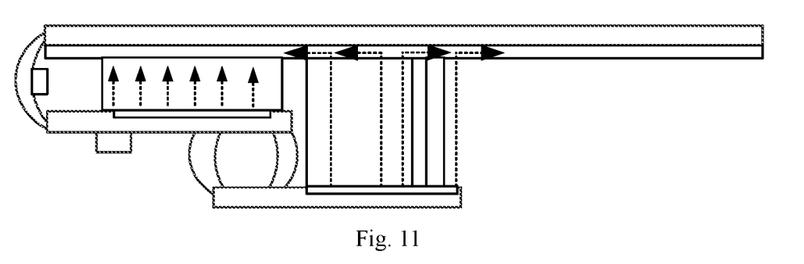
FIG. 11 is a state diagram of another vehicle-mounted display apparatus provided in an embodiment of the present disclosure.

In the example of the invention, as shown in FIG. 10, the copper leakage regions may be arranged on the first circuit board 31 and the second circuit board 32 to be electrically connected with the metal backboard 2, to accelerate conduction of EMI energy to the GND. The configuration positions of the copper leakage regions on the first circuit board and the second circuit board 32 are not limited herein, and may be configured according to actual situations. For example, the first copper leakage region A1 is arranged on the first back surface of the first circuit board 31, the first copper leakage region A1 of the first back surface is electrically connected with the metal backboard 2 through the double-sided conductive adhesive 52, the second copper leakage region A2 is arranged on the second back surface of the second circuit board 32, the second copper leakage region A2 of the second back surface is electrically connected with the metal backboard 2 through the conductive stud 7 and the conductive foam 53, grounding paths of the copper leakage regions on the first circuit board 31 and the second circuit 32 may be as shown in FIG. 11, a connection structure of the copper leakage region and the metal backboard 2 is simple, the grounding path of the circuit board may be increased, and the grounding path of the grounded circuit board may be shortened, such that EMI on the circuit board may be fully conducted away from the GND, problems of a white screen and a black screen of the display panel 1 in some frequency bands are solved, and the vehicle-mounted display apparatus satisfies the requirements of EMC in a full frequency band test, has a simple structure, and is easy to manufacture without increase in cost.

It should be noted that shapes, sizes, and thicknesses of all components of the vehicle-mounted display apparatus drawn in FIGS. 2-11 are schematic, and do not represent actual shapes, sizes, and thicknesses.

Apparently, those skilled in the art can make various modifications and variations to examples of the present disclosure without departing from the spirit and scope of the present disclosure. In this way, if these modifications and variations of the present disclosure fall within the scope of the claims of the present disclosure and equivalent technologies of the claims, the present disclosure is also intended to include these modifications and variations.

What is claimed is:

1. A vehicle-mounted display apparatus, comprising:
   a display panel, comprising a display surface and a non-display surface facing away from the display surface;
   a metal backboard, arranged on a side at which the non-display surface is located, wherein the metal backboard is grounded; and
   a circuit board assembly, comprising a first circuit board arranged on a side of the metal backboard away from the display panel; wherein the first circuit board is in signal connection with the display panel through a first flexible printed circuit, the first circuit board comprises a first front surface facing away from the metal backboard, and a first back surface facing to the metal backboard; wherein the first front surface is provided with circuit patterns, at least one surface of the first circuit board is provided with a first copper leakage region, and the first copper leakage region is electrically connected with the metal backboard through a first conductive mechanism;
   wherein the first front surface has a plurality of first copper leakage regions, the plurality of first copper leakage regions of the first front surface do not overlap the circuit patterns of the first front surface, the first conductive mechanism comprises conductive adhesive tape, and the plurality of first copper leakage regions of the first front surface are electrically connected with the metal backboard through the conductive adhesive tape.

2. The vehicle-mounted display apparatus according to claim 1, wherein the plurality of first copper leakage regions of the first front surface are arranged adjacent to an edge of the first circuit board.

3. The vehicle-mounted display apparatus according to claim 1, wherein the first back surface has at least one first copper leakage region, the first conductive mechanism comprises a double-sided conductive adhesive between the first circuit board and the metal backboard, and the at least one first copper leakage region of the first back surface is electrically connected with the metal backboard through the double-sided conductive adhesive.

4. The vehicle-mounted display apparatus according to claim 3, wherein the at least one first copper leakage region of the first back surface is arranged on the entire first back surface.

5. The vehicle-mounted display apparatus according to claim 1, wherein the first front surface of the first circuit board is covered with an electromagnetic interference shielding film.

6. The vehicle-mounted display apparatus according to claim 1, wherein the first circuit board is a timing controller board.

7. The vehicle-mounted display apparatus according to claim 1, wherein the circuit board assembly further comprises a second circuit board arranged on a side of the first circuit board away from the metal backboard; wherein the second circuit board is in signal connection with the first circuit board through a second flexible printed circuit and comprises a second front surface facing away from the metal backboard, and a second back surface facing to the metal backboard, at least one surface of the second circuit board is provided with a second copper leakage region, and the second copper leakage region is electrically connected with the metal backboard through a second conductive mechanism.

8. The vehicle-mounted display apparatus according to claim 7, wherein the second back surface has at least one second copper leakage region, the second conductive mechanism comprises a conductive stud, the second circuit board is fixedly connected with the metal backboard via the conductive stud extending in a first direction, the conductive stud is in contact with the at least one second copper leakage region of the second back surface, and the first direction is an arrangement direction of the second circuit board and the metal backboard.

9. The vehicle-mounted display apparatus according to claim 8, wherein the second conductive mechanism comprises conductive foam between the second circuit board and the metal backboard, and the at least one second copper leakage region of the second back surface is electrically connected with the metal backboard through the conductive foam.

10. The vehicle-mounted display apparatus according to claim 8, wherein the at least one second copper leakage region of the second back surface is arranged on the entire second back surface.

11. The vehicle-mounted display apparatus according to claim 7, wherein the second circuit board is a system on chip board.

12. The vehicle-mounted display apparatus according to claim 1, wherein the first flexible printed circuit is a chip on film.

13. A vehicle-mounted display apparatus, comprising:
a display panel, comprising a display surface and a non-display surface facing away from the display surface;
a metal backboard, arranged on a side at which the non-display surface is located, wherein the metal backboard is grounded; and
a circuit board assembly, comprising a first circuit board arranged on a side of the metal backboard away from the display panel; wherein the first circuit board is in signal connection with the display panel through a first flexible printed circuit, the first circuit board comprises a first front surface facing away from the metal backboard, and a first back surface facing to the metal backboard; wherein the first front surface is provided with circuit patterns, at least one surface of the first circuit board is provided with a first copper leakage region, and the first copper leakage region is electrically connected with the metal backboard through a first conductive mechanism;
wherein the first back surface has at least one first copper leakage region, the first conductive mechanism comprises a double-sided conductive adhesive between the first circuit board and the metal backboard, and the at least one first copper leakage region of the first back surface is electrically connected with the metal backboard through the double-sided conductive adhesive.

14. The vehicle-mounted display apparatus according to claim 13, wherein the at least one first copper leakage region of the first back surface is arranged on the entire first back surface.

15. The vehicle-mounted display apparatus according to claim 13, wherein the first front surface of the first circuit board is covered with an electromagnetic interference shielding film.

16. A vehicle-mounted display apparatus, comprising:
a display panel, comprising a display surface and a non-display surface facing away from the display surface;
a metal backboard, arranged on a side at which the non-display surface is located, wherein the metal backboard is grounded; and
a circuit board assembly, comprising a first circuit board arranged on a side of the metal backboard away from the display panel, and a second circuit board arranged on a side of the first circuit board away from the metal backboard;
wherein the first circuit board is in signal connection with the display panel through a first flexible printed circuit, the first circuit board comprises a first front surface facing away from the metal backboard, and a first back surface facing to the metal backboard; the first front surface is provided with circuit patterns, at least one surface of the first circuit board is provided with a first copper leakage region, and the first copper leakage region is electrically connected with the metal backboard through a first conductive mechanism;
the second circuit board is in signal connection with the first circuit board through a second flexible printed circuit and comprises a second front surface facing away from the metal backboard, and a second back surface facing to the metal backboard, at least one surface of the second circuit board is provided with a second copper leakage region, and the second copper leakage region is electrically connected with the metal backboard through a second conductive mechanism.

17. The vehicle-mounted display apparatus according to claim 16, wherein the second back surface has at least one second copper leakage region, the second conductive mechanism comprises a conductive stud, the second circuit board is fixedly connected with the metal backboard via the conductive stud extending in a first direction, the conductive stud is in contact with the at least one second copper leakage region of the second back surface, and the first direction is an arrangement direction of the second circuit board and the metal backboard.

18. The vehicle-mounted display apparatus according to claim 17, wherein the second conductive mechanism comprises conductive foam between the second circuit board and the metal backboard, and the at least one second copper leakage region of the second back surface is electrically connected with the metal backboard through the conductive foam.

19. The vehicle-mounted display apparatus according to claim 17, wherein the at least one second copper leakage region of the second back surface is arranged on the entire second back surface.

20. The vehicle-mounted display apparatus according to claim 16, wherein the second circuit board is a system on chip board.

* * * * *